United States Patent
Hodapp et al.

(10) Patent No.: US 7,068,200 B1
(45) Date of Patent: Jun. 27, 2006

(54) METHODS AND CIRCUIT FOR SUPPRESSING TRANSIENTS IN AN OUTPUT DRIVER AND DATA CONVERSION SYSTEMS USING THE SAME

(75) Inventors: Stephen Timothy Hodapp, Austin, TX (US); Timothy Thomas Rueger, Austin, TX (US); Bruce Eliot Duewer, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/868,329

(22) Filed: Jun. 15, 2004

(51) Int. Cl.
*H03M 1/66* (2006.01)
(52) U.S. Cl. .................................. 341/144; 341/145
(58) Field of Classification Search ................ 341/144, 341/145
See application file for complete search history.

(56) References Cited

U.S. PATENT DOCUMENTS

| | | | | |
|---|---|---|---|---|
| 3,918,004 A | * | 11/1975 | Shimizu et al. ............. | 330/261 |
| 5,965,958 A | * | 10/1999 | Harwood ..................... | 307/125 |
| 6,281,821 B1 | * | 8/2001 | Rhode et al. ................ | 341/144 |
| 6,462,889 B1 | * | 10/2002 | Jackson ....................... | 359/728 |
| 6,492,928 B1 | * | 12/2002 | Rhode et al. ................ | 341/144 |
| 6,498,530 B1 | * | 12/2002 | Tang ............................. | 330/9 |
| 6,522,278 B1 | * | 2/2003 | Rhode et al. ................ | 341/144 |
| 6,600,365 B1 | * | 7/2003 | Frith ............................ | 330/51 |
| 6,775,387 B1 | * | 8/2004 | Mavencamp et al. ....... | 381/120 |

* cited by examiner

*Primary Examiner*—Rexford Barnie
*Assistant Examiner*—Joseph Lauture
(74) *Attorney, Agent, or Firm*—James J. Murphy; Thompson & Knight LLP

(57) ABSTRACT

A driver circuit with power-down transient suppression includes an amplifier for driving a load coupled to an output of the amplifier, a ramp-down voltage generator having a capacitor and a resistor for generating a ramp-down voltage during power-down of the amplifier, and a differential transistor pair responsive to the ramp-down voltage for pulling-down current at the output of the amplifier during power-down of the amplifier.

19 Claims, 8 Drawing Sheets

METHODS AND CIRCUIT FOR SUPPRESSING TRANSIENTS IN AN OUTPUT DRIVER AND DATA CONVERSION SYSTEMS USING THE SAME

FIELD OF INVENTION

The present invention relates in general to linear electronic circuits and in particular to methods and circuits for suppressing transients in an output driver and data conversion systems using the same.

BACKGROUND OF INVENTION

Purchasers of state of the art home and portable audio systems expect improved audio performance, as well as more options for controlling playback from the given recording media. One of the most important performance criteria is the elimination of clicks, pops, noise and other artifacts audible to the listener. Not only are these audible artifacts distracting, but they can also damage the system speakers or headset. This problem is especially true with transient artifacts, such as clicks and pops, which may spike the output signal driving the speakers or headset to a relatively high level.

Clicks and pops can be caused by a number of different conditions. One particular situation when clicks and pops arise in digital audio systems is during power transitions, such as during system power-up or power-down. Typically, the analog to digital converter (DAC) stage, which converts the digital audio input stream to analog form, is coupled through a capacitor to the following analog processing circuitry. During power transitions, the stored charge on this coupling capacitor must be discharged slowly to ensure that a voltage spike is not passed to the analog processing circuitry, which would otherwise convert the voltage spike into an audible click or pop.

While there are presently a number of different techniques for controlling clicks and pops, including the control of clicks and pops in audio analog to digital converters, these techniques adversely impact other aspects of system performance. Consequently, new circuits and methods are needed which control clicks, pops without significantly impacting other aspects of system performance.

SUMMARY OF INVENTION

The principles of the present invention reduce or eliminate transients in an output driver, such as the operational amplifier circuit at the output of a digital to analog converter, during power-down. According to one particular embodiment, a driver circuit with power-down transient suppression is disclosed which includes an amplifier for driving a load coupled to an output of the amplifier, a ramp-down voltage generator having a capacitor and a resistor for generating a ramp-down voltage during power-down of the amplifier, and a differential transistor pair responsive to the ramp-down voltage for pulling-down current at the output of the amplifier during power-down of the amplifier.

Advantageously, a ramp-down voltage is generated by a resistor and a capacitor, which in turn controls a differential pair, which pulls current from the driver output during power-down thereby allowing the output to smoothly transition, even in the presence of an output load. Specifically, charge on any external coupling capacitor or similar load is smoothly discharged from that load which eliminates or reduces voltage spikes and other transients. According to further embodiments of the present invention, the driver includes an operational amplifier associated with a common mode input voltage and a higher common mode output voltage. An isolation switch in the operational amplifier feedback loop isolates the input and output during amplifier power down to prevent current flow from the amplifier output to the amplifier input and thereby avoid transients in the driver output.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1:
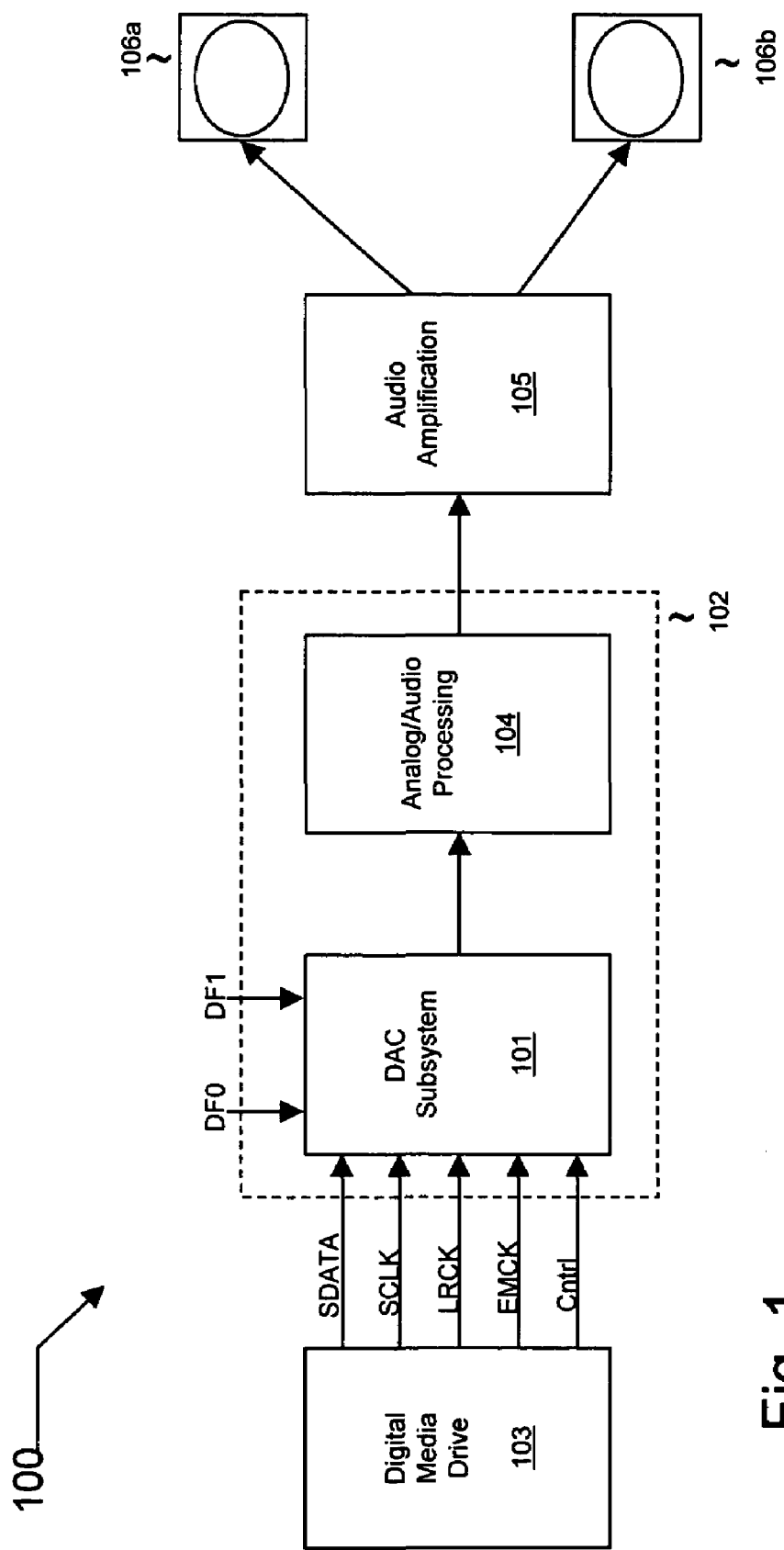
FIG. 1 is a high level block diagram of a digital audio system suitable for describing one system application of the principles of the present invention.

FIG. 1 is a diagram of a typical audio system 100 utilizing a digital-to-analog converter subsystem (DAC) 101 according to the principles of the present invention. In this example, DAC subsystem 101 forms part of an audio component 102, such as a compact disk (CD) player, digital audio tape (DAT) player or digital versatile disk (DVD) unit. A digital media drive 103 recovers the digital data and passes those data, along with clocks and control signals, to DAC subsystem 101. The resulting analog (audio) signal undergoes further processing in analog/audio processing circuit block 104 prior to amplification in audio amplifier block 105. Amplifier block 105 then drives a set of conventional speakers 106a and 106b.

Multi-bit digital audio data is received by DAC subsystem 101 serially through the SDATA pin timed by the serial clock (SCLK) signal. The left and right channel data are alternately processed in response to the left-right clock (LRCK) signal, which is normally at the sampling rate. In system 100, the external master clock (EMCK) signal is received by DAC subsystem 101 from digital media drive 103.

Figure 2:
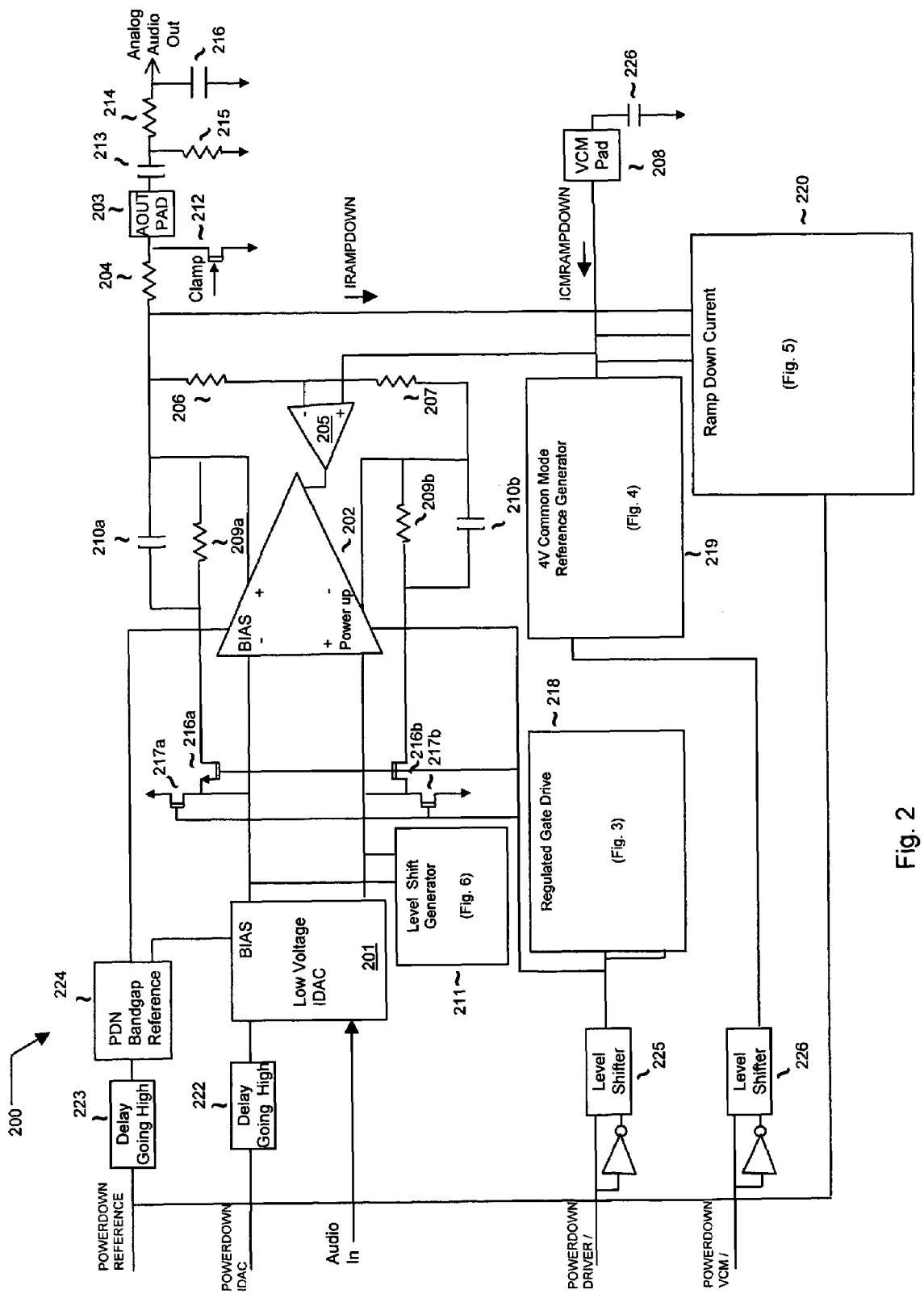
FIG. 2 is an electrical schematic diagram of an exemplary digital to analog converter according to the principles of the present invention and suitable for use in the digital audio system of FIG. 1.

FIG. 2 is an electrical schematic diagram of a digital to analog converter 200 embodying the principles of the present invention. In the illustrated embodiment, DAC 200 is an audio DAC, which receives a channel of digital audio data AUDIO IN and outputs an audio output signal analog AUDIO OUT. The illustrated embodiment of DAC 200 is suitable for use in such applications as audio system 100 described above in conjunction with FIG. 1. The principles of the present invention are not limited, however, to audio DACs, but may be utilized in a range of systems applications requiring the conversion of digital data into analog form.

The digital stream AUDIO IN is input into a low voltage current-based (continuous-time) digital to analog converter (IDAC) 201. The differential outputs of IDAC 201, after the level shifting discussed further below, drive corresponding inverting (−) and noninverting (+) low voltage inputs of an operational amplifier stage 202. Operational amplifier 202 includes differential (+ and −) outputs, with the noninverting (+) output driving analog output (AOUT) pad 203 through resistor 204.

Operational amplifier 202 operates around an input common mode voltage of approximately one (1) volt. The operational amplifier 202 common mode output voltage is approximately 4 volts and is controlled by common mode differential amplifier 205. The voltage at the inverting (−) input to common mode differential amplifier 205 is set by voltage divider formed by resistors 206 and 207 bridging the noninverting (+) and inverting (−) outputs of operational amplifier 202. The noninverting (+) input to that common mode amplifier 205 is tied to the common mode voltage (VCM) reference pad 208.

Differential operational amplifier 202 is associated with two feedback loops, one, which couples the inverting (−) input and the noninverting (+) output, includes a feedback resistor 209a and a feedback capacitor 210a. The second feedback loop, which couples the noninverting (+) input and the inverting (−) output of operational amplifier 202, includes a feedback resistor 209b and a feedback capacitor 210b. Level shift generator 211 ensures that there is an approximately three (3) volt voltage drop across resistors 209a and 209b such that the inputs to operational amplifier 202 remain within a safe operating voltage range.

A clamp transistor 212 at analog output (AOUT) pad 203 clamps the voltage at AOUT pad 203, in response to the control signal CLAMP, to a voltage less than the stored voltage on external AC coupling capacitor 213. An external load coupled to AC coupling capacitor 213 is represented in the embodiment of FIG. 2 by resistors 214 and 215 and capacitor 216.

A voltage step in the output signal ANALOG AUDIO OUT could occur if current is suddenly pulled through AC coupling capacitor 213 from the external load of resistors 214–215 and capacitor 216. Generally, the larger the external load impedance is the larger the voltage step becomes. In particular, AC coupling capacitor 213 passes fast transients, similar to a short, creating a current step, which creates a voltage spike in the external load and a pop in the audio output. According to the principles of the present invention, isolation transistors 216a and 216b under the control of regulated gate drive 218 respectively isolate the inverting (−) and noninverting (+) inputs of operational amplifier 202 from output pad 203 during the power down operations discussed below. Specifically, isolation transistors 216a and 216b prevent current flow through the external resistors 214–215, external capacitor 216, and external AC coupling cap 213, to the inverting (−) and non-inverting (+) inputs of operational amplifier 202, which must be held at a voltage lower than the output common mode voltage to protect the low voltage input circuitry, such that a large voltage spike, and consequently an audible pop, is not produced in the signal ANALOG OUT. Pulldown transistors 217a and 217b, also under the control of regulated gate drive 218, respectively pull the inverting (−) and noninverting (+) inputs of operational amplifier 202 to a known voltage, in the illustrated embodiment to ground, after isolation transistors 216a and 216b turn-off. The drive to the gates of pull-down transistors 217a and 217b is not regulated in the illustrated embodiment.

Figure 3:
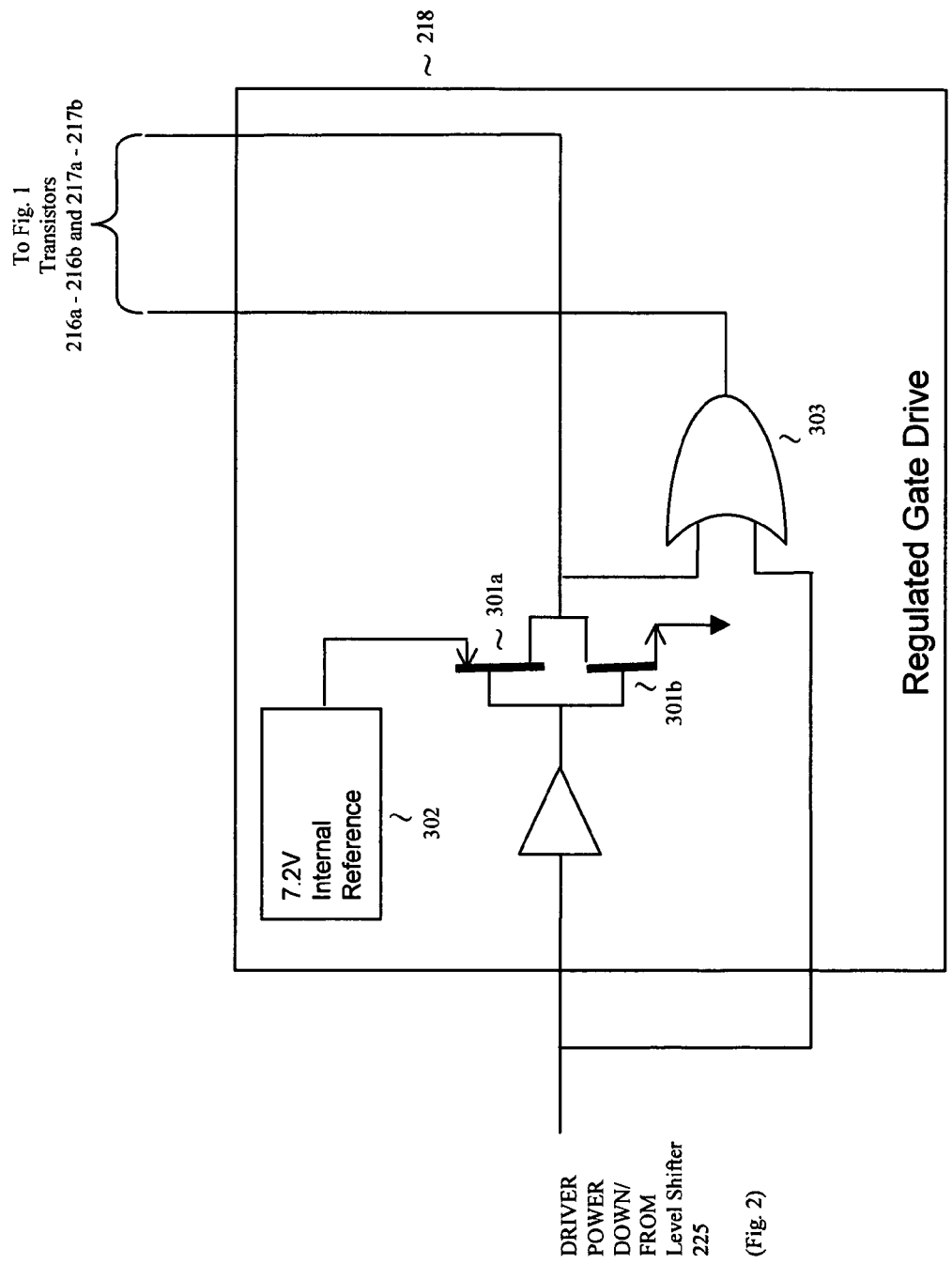
FIG. 3 is an electrical schematic diagram of an exemplary embodiment of the regulated gate drive shown in FIG. 2.

FIG. 3 is a more detailed electrical schematic diagram of regulated gate drive 218 of FIG. 2. As shown in FIG. 3, regulated gate drive 218 includes transistors 301a and 301b which generate an isolation switch gate drive to the gates of isolation transistors 216a–216b in response to the DRIVER POWER DOWN/ control signal from a 7.2 volt internal reference voltage source 302. A NOR gate 303 generates pulldown gate drive to the gates of pulldown transistors 217a–217b in response to the control signal DRIVER POWER DOWN/ and the output of transistors 301a and 301b.

Figure 4:
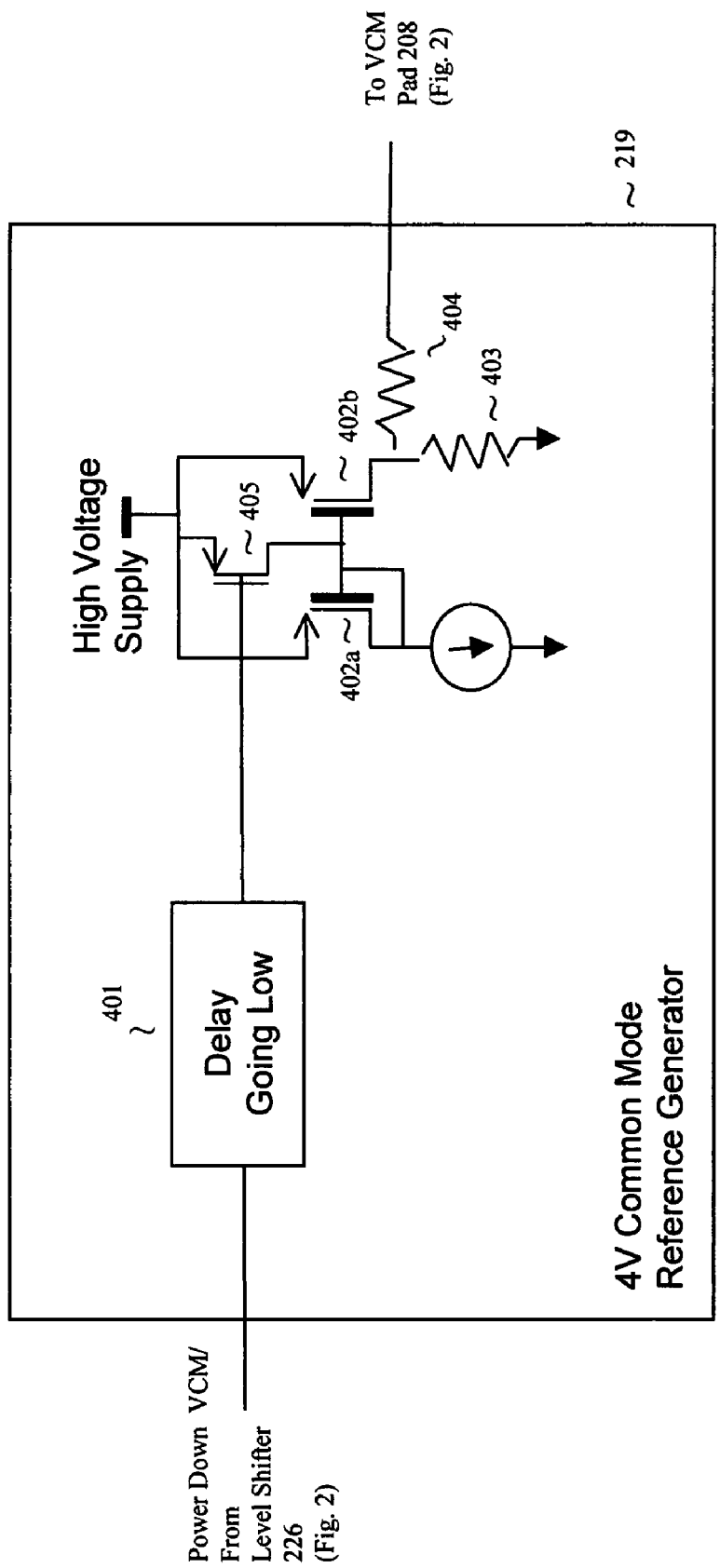
FIG. 4 is an electrical schematic diagram of an exemplary embodiment of the common mode reference generator shown in FIG. 2.

Common mode reference generator 219 of FIG. 2, as shown in detail in FIG. 4, generates the voltage at VCM pad 208 and the noninverting (+) input of common mode differential amplifier 205. As shown in FIG. 4, common mode reference generator 219 includes a delay 401 which delays the falling edge of the active low common mode voltage power down signal POWER DOWN VCM/ such that common mode reference generator 219 power-downs after operational amplifier 202 of FIG. 2 powers-down. Common mode reference generator 219 includes a pair of transistors 402a and 402b, a grounded resistor 403 and a filter resistor 404 which drives VCM pad 208 and the inverting input of common mode amplifier 205 during normal operations. A transistor 405 drives transistors 402a and 402b from a high voltage supply in response to the output from delay 401.

During ramp down, currents from output pad 203 and VCM pad 208 are controlled by ramp down current generator 220 of FIG. 2. Ramp down current generator 220 is shown in further detail in FIG. 5 and includes differential pair transistors 501a and 501b, which in the preferred embodiment are low voltage transistors operating from a low voltage supply to save chip area. Differential transistors 501a and 501b drive transistor 502b which sinks the current IRAMPDOWN flowing through the output pad 203 during circuit ramp down. Similarly, transistor 503b sinks the current ICMRAMPDOWN from the output of common mode reference generator 219 and VCM pad 208 during ramp down operations. Transistors 502a and 503a are activated during power-down by the control signal POWER DOWN REFERENCE input on FIG. 2. Level shifting transistor 504 shifts down the voltage on VCM pad 208 to the low voltage supply level. A second set of transistors 505a–505b are provided for ramping down the output voltage of a second operational amplifier and associated output pad (not shown).

Returning to FIG. 2, power-down of IDAC 201 is controlled by the control signal POWER DOWN IDAC as delayed by delay 222. The control signal POWER DOWN REFERENCE, as delayed through delay 223, controls power-down of bandgap reference 224 which provides the current biases to IDAC 201 and operational amplifier 202. Level shifters 225 and 226 shift the low-level control signals DRIVER POWER DOWN\ and POWER DOWN VCM\ to the higher levels required by VCM generator 219 and regulated gate drive 218. To prevent pops in the audio output, the outputs of level shifters 225 and 226 go to a known state which powers-down operational amplifier 202 if the low voltage supply is removed before the high voltage supply.

Figure 6:
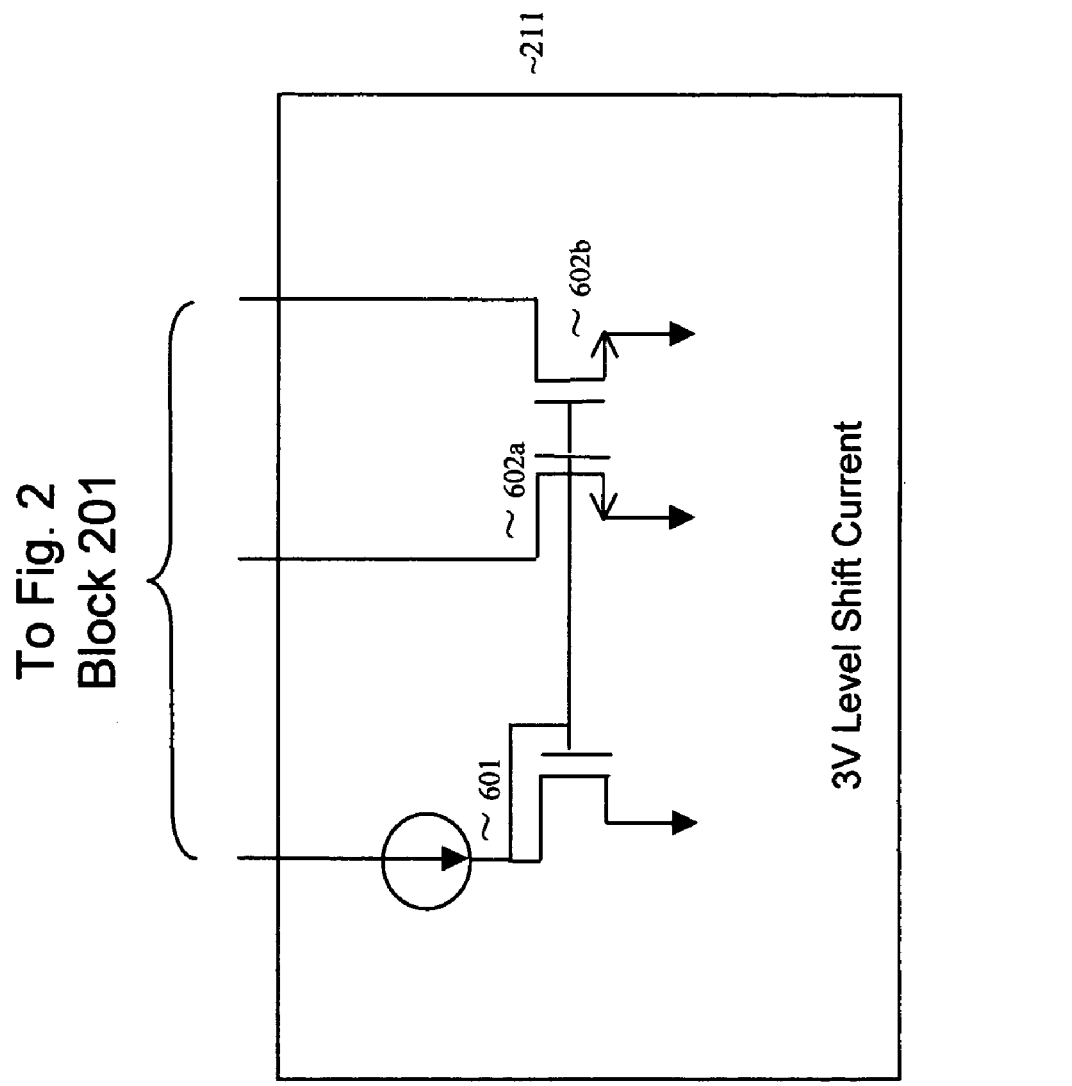
FIG. 6 is an electrical schematic diagram of an exemplary embodiment of the level shift generator shown in FIG. 2.

FIG. 6 is an electrical schematic diagram of level shift generator 211 shown in FIG. 2. A transistor 601 sinks a reference current from low voltage IDAC 201 while level shifting transistor 602a and 602b respectively sink current through feedback resistors 209a and 209b to create the approximately three volt voltage drop between the inputs and outputs of operational amplifier 202.

Figure 7:
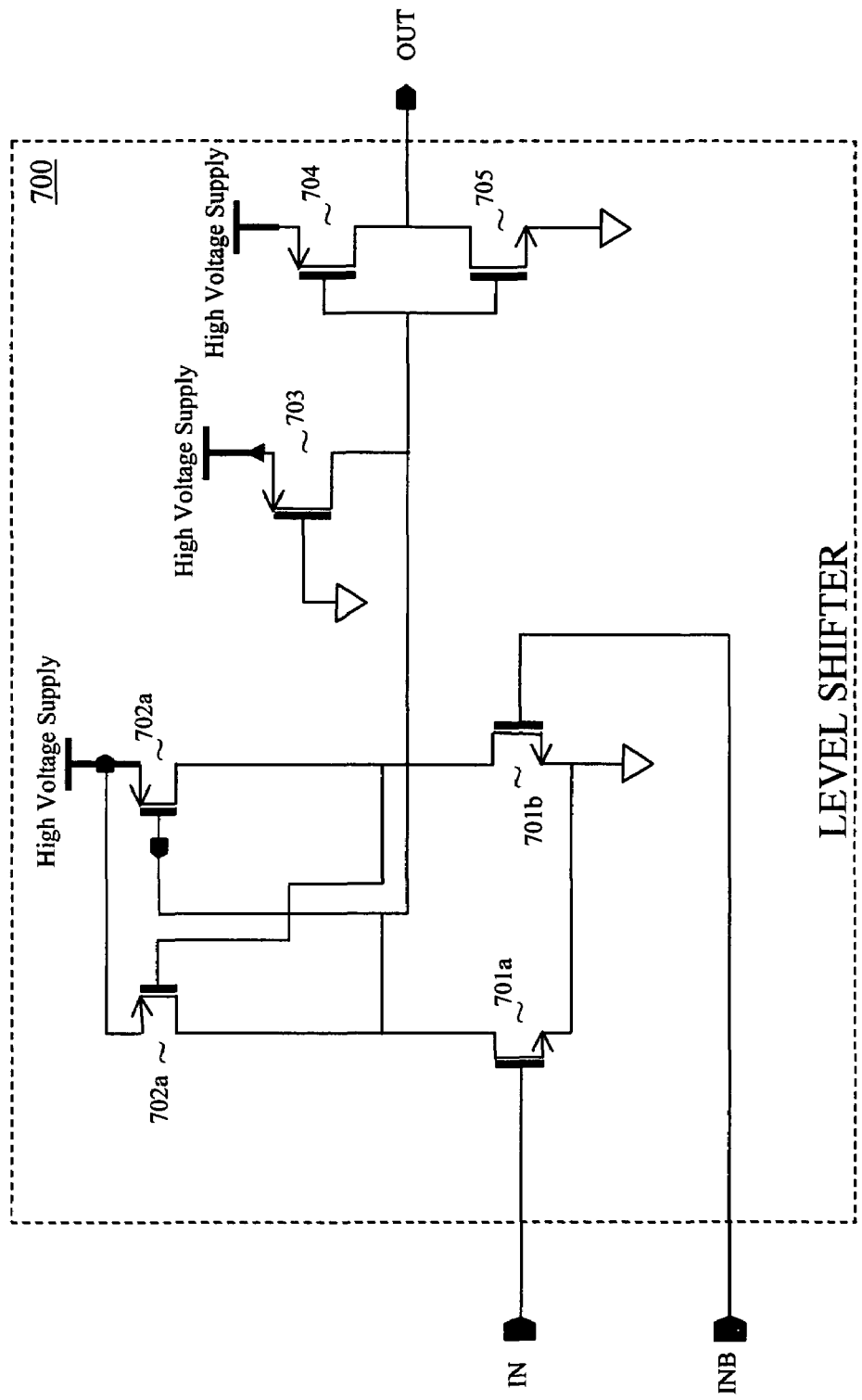
FIG. 7 is an electrical schematic diagram of the signal voltage level shifters shown in FIG. 2.

An exemplary level shifter circuit 700, suitable for utilization in level shifters 225 and 226 of FIG. 2 is shown in the electrical schematic diagram of FIG. 7. In the illustrated embodiment, level shifter circuitry 700 includes a pair of input transistors 701a and 701b respectively receiving the input signal IN and its complement INB. Load transistors 702a and 702b operate from the system high voltage supply to shift input signals IN and INB from the system low voltage supply level to the system high voltage supply level. Output transistors 704 and 705 drive the output signal OUT at the up-shifted high voltage supply level. A pull-up transistor 703 pulls-up the gates of output transistors 704 and 705. If the low voltage supply, generating the input signals IN and INB, shuts-down before the high voltage supply, transistors 701a and 701b turn-off. The gate of transistor 705 is then pulled-high by pull-up transistor 703. Transistor 705 turns-on and pulls the output OUT to ground.

Figure 8:
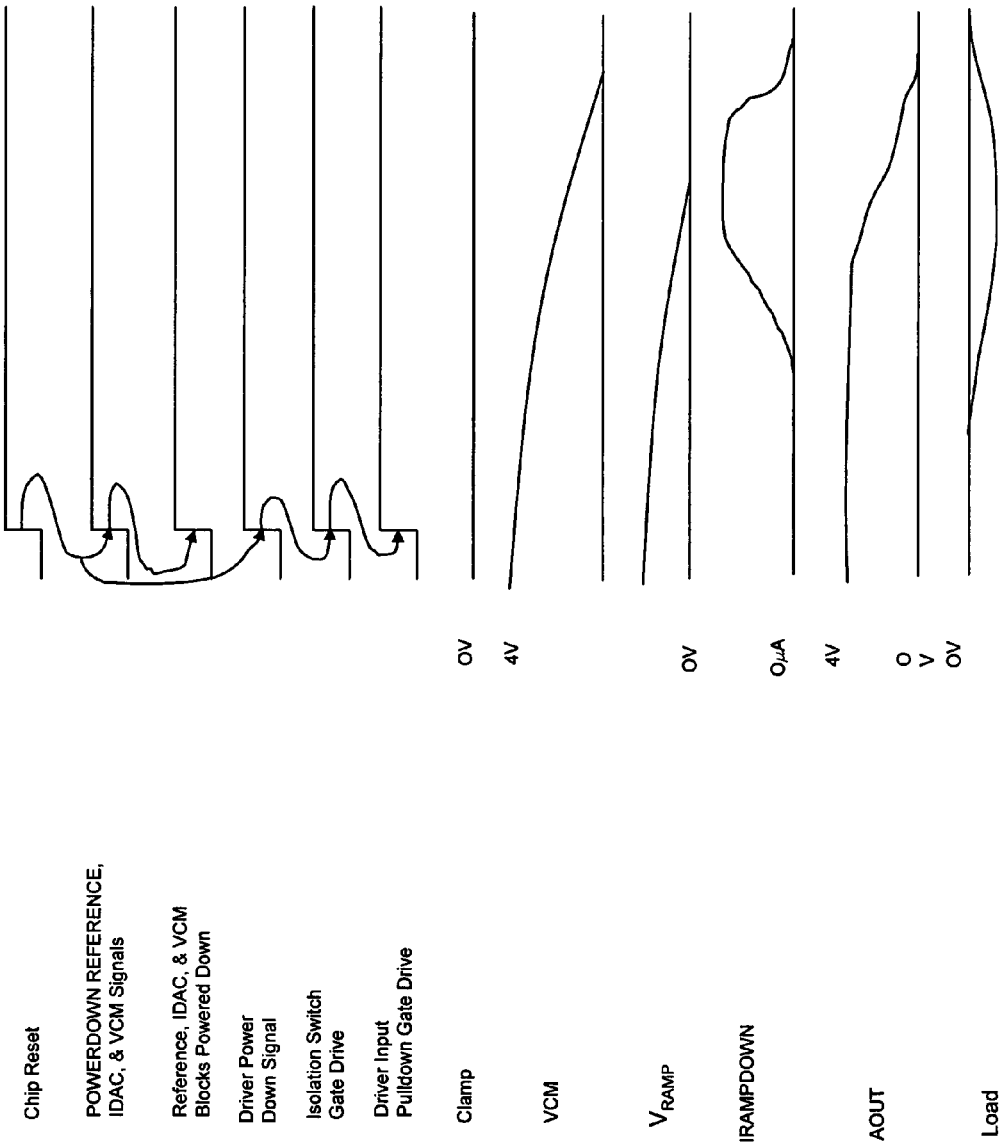
FIG. 8 is a timing diagram illustrating exemplary operations during the power-down of the exemplary digital to analog converter shown in FIG. 2.

Exemplary power down operations of DAC 100 are illustrated in the timing diagrams of FIG. 8. In this example, power down is initiated with the chip reset signal CHIP RESET, which triggers the generation of the active states of the control signals POWERDOWN REFERENCE, POWERDOWN IDAC, POWERDOWN VCM/, and POWERDOWN DRIVER/. Power-down of bias reference generator 224, IDAC 201, and VCM generator 219 are delayed by delays 222, 223 (FIG. 2), and 401 (FIG. 4) relative to power-down of operational amplifier 202 to prevent glitches.

High voltage n-channel switches 216a and 216b turn-on to isolate the inputs from the outputs of operational amplifier 202 during power down. After operational amplifier 202 has powered-down, regulated gate drive 218 turns on transistors 217a and 217b which pull-down the inputs of operational amplifier 202 to a known state. The gate drive of the isolation switches 216a and 216b is also regulated during normal operation to improve power supply rejection.

Figure 5:
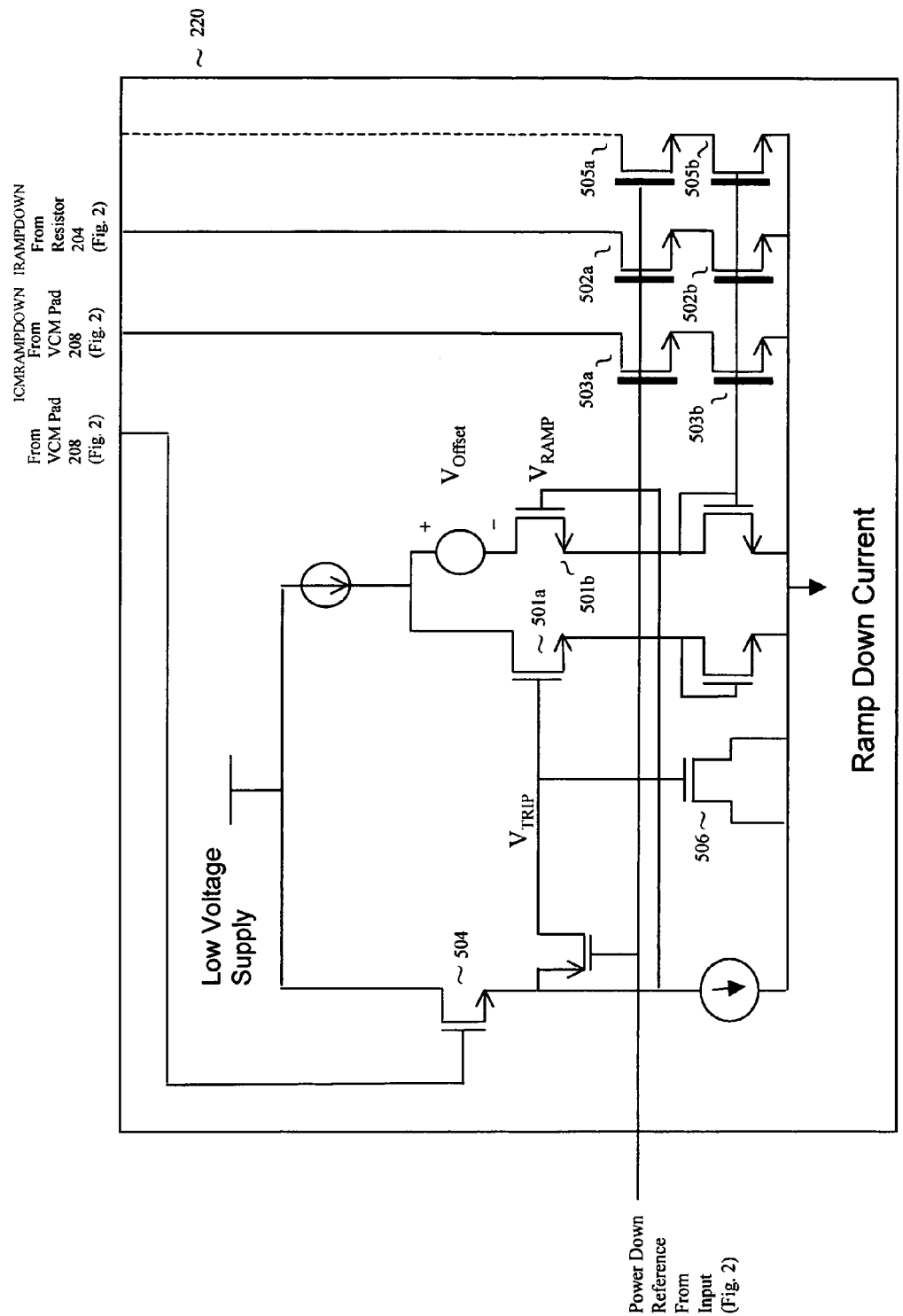
FIG. 5 is an electrical schematic diagram of an exemplary embodiment of the ramp-down current generator shown in FIG. 2.

An external reference capacitor 226 on VCM pad 208 is charged before VCM generator 219 is powered-down. Specifically, the VCM level is generated by a current through grounded resistor 403 of FIG. 4 which then drives through filter resistor 404 into external capacitor 226. For smooth ramp down, VCM pad 208 is utilized to create a slow voltage ramp, which when applied to differential pair transistors 501a and 501b of ramp down current generator 219, as shown in FIG. 5, generates a ramped current from output pad 203. Amplifier 202 turns-off just before ramp-down begins.

When VCM generator 219 powers-down, the Vcm reference voltage on external reference capacitor 226 ramps down as current is drawn through grounded resistor 403 and filter resistor 404 of FIG. 4. The time constant defined by resistors 403 and 404 and external capacitor 226 of FIG. 2 approximates the desired value for discharging ac coupling cap 203 coupled to AOUT pad 203. To fine tune the VCM ramp, transistors 503a and 503b of FIG. 5 pull additional current out of external reference capacitor 226 during Vcm ramp down.

A voltage $V_{TRIP}$ is sampled from the low voltage supply rail onto MOS capacitor 506 of FIG. 5. As the voltage $V_{RAMP}$ decays, the voltage at the gates of differential pair transistors 501a and 501b of FIG. 5 also decays. As shown in FIG. 7, the current pulled from output pad 203 slowly ramps from 0 up to a maximum and then back to 0 as the output of opamp 202 approaches 0V. Differential pair transistors 501a and 501b have a built in offset voltage $V_{offset}$ such that the output current drawn from output pad 203 starts at 0 even though the ramp voltage $V_{RAMP}$ starts at the same potential as $V_{TRIP}$.

To save area, low voltage transistors were used for ramp down differential pair transistors 501a and 501b of FIG. 5, so the voltage at Vcm reference pin 208 of FIG. 2 is level shifted down through transistor 504 to the low voltage supply voltage.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A driver circuit with power-down transient suppression comprising:
    an amplifier for driving a load coupled to an output of the amplifier;
    a ramp down voltage generator including a capacitor and a resistor for generating a ramp-down voltage during power-down of the amplifier; and
    a differential transistor pair responsive to the ramp-down voltage for pulling-down current at the output of the amplifier during power-down of the amplifier wherein at least one transistor of the differential pair implements an offset such that an initial current pulled-down from the output of the amplifier is approximately zero.

2. The driver circuit of claim 1, wherein the amplifier comprises an operational amplifier having an input for receiving an input voltage and an output for outputting an output voltage greater than the input voltage and a feedback loop coupling the input and the output, the driver circuit further including an isolation switch in the feedback loop for isolating the input and output of the operational amplifier during power-down of the operational amplifier.

3. The driver circuit of claim 1, further comprising control circuitry for controlling power-down of the operational amplifier in response to a received control signal, the control circuitry operating at a voltage and the control signal generated from another voltage, the driver circuitry further including a level shifter for shifting a level of the control signal from the another voltage to the voltage.

4. The driver circuit of claim 3, wherein an output of the level shifter defaults to a known state in the absence of the control signal causing the control circuitry to power-down the operational amplifier.

5. The driver circuit of claim 3, further comprising delay circuitry for powering-down the control circuitry until after power-down of the operational amplifier.

6. A method of suppressing transients at an output of an amplifier driving a load, comprising:
    generating a ramp-down voltage with a capacitor and a resistor during power-down of the amplifier; and
    pulling-down current at the output of the amplifier during power-down of the amplifier with a differential transistor pair responsive to the ramp-down voltage wherein at least one transistor of the differential pair implements an offset such that an initial current pulled-down from the output of the amplifier is approximately zero.

7. The method of claim 6, wherein the amplifier is associated with an input common mode voltage and an output common mode voltage greater than the input common mode voltage, an input and an output of the amplifier coupled by a feedback loop, the method further comprising:

isolating the input and the output of the amplifier during power-down of the amplifier with an isolation switch in the feedback loop.

8. The method of claim 6, further comprising implementing an offset in the differential pair to set an initial current pulled-down from the output of the amplifier.

9. The method of claim 6, wherein the amplifier is associated with control circuitry for controlling power-down of the amplifier, and the method further comprises:

delaying power-down of the control circuitry until after power-down of the amplifier.

10. The method of claim 9, wherein the control circuitry operates at a first voltage level in response to a control signal of a second voltage level, and the method further comprises shifting the control signal from the second voltage level to the first voltage level.

11. The method of claim 10, wherein a control circuitry output defaults to a known state for powering-down the amplifier when the control signal is disabled.

12. A digital to analog converter system comprising:
a digital to analog converter array;
an operational amplifier coupled to an output of the digital to analog converter array for driving an output load;
a common mode reference generator for setting a common mode output voltage of the operational amplifier, the common mode reference generator including a first resistor for charging a reference capacitor during steady state operation of the operational amplifier and a second resistor for discharging the reference capacitor during power-down of the operational amplifier to generate a ramp-down signal; and
a ramp-down signal generator for pulling current from an output of the operational amplifier during power-down in response to the ramp-down signal.

13. The digital to analog converter system of claim 12, wherein the operational amplifier further includes a feedback loop coupling an input and an output of the operational amplifier and the digital to analog converter system further comprises circuitry for opening the feedback loop to isolate the input and output during power-down of the operational amplifier.

14. The digital to analog converter system of claim 13, wherein the operational amplifier operates with a common mode output voltage greater than a common mode input voltage.

15. The digital to analog converter system of claim 12, further comprising circuitry for delaying power-down of the common mode reference generator and the ramp-down signal generator until after power-down of the operational amplifier.

16. The digital to analog converter system of claim 12, wherein the common mode reference generator and the ramp-down signal generator operate from a first power supply and are controlled by a control signal generated for a second power supply, and the digital to analog converter system further comprises a level shifter for level shifting the control signal, the level shifter outputting a default signal to the common mode reference generator and the ramp-down signal generator from powering-down the operational amplifier in the absence of the control signal.

17. The digital to analog converter system of claim 12, wherein the operational amplifier comprises a differential operational amplifier.

18. The digital to analog converter system of claim 12, wherein the digital to analog converter array comprises an array of current elements.

19. The digital to analog converter system of claim 12 forming a portion of a digital audio system.

* * * * *